(12) United States Patent
Kawai et al.

(10) Patent No.: US 7,164,605 B2
(45) Date of Patent: *Jan. 16, 2007

(54) SEMICONDUCTOR MEMORY DEVICE AND ELECTRIC DEVICE WITH THE SAME

(75) Inventors: Koichi Kawai, Yokohama (JP); Tomoharu Tanaka, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/305,193

(22) Filed: Dec. 19, 2005

(65) Prior Publication Data
US 2006/0092708 A1 May 4, 2006

Related U.S. Application Data

(63) Continuation of application No. 10/856,986, filed on Jun. 1, 2004, now Pat. No. 6,977,845.

(30) Foreign Application Priority Data
Jun. 30, 2003 (JP) ............................. 2003-188330

(51) Int. Cl.
*G11C 16/06* (2006.01)
(52) U.S. Cl. ...................... 365/185.21; 365/185.12; 365/185.17
(58) Field of Classification Search ............... 365/191, 365/185.11, 185.12, 185.17, 189.01, 189.04
See application file for complete search history.

(56) References Cited

U.S. PATENT DOCUMENTS

| 5,319,595 | A | 6/1994 | Saruwatari | |
| 5,986,918 | A | 11/1999 | Lee | |
| 6,317,364 | B1* | 11/2001 | Guterman et al. | 365/185.28 |
| 6,442,076 | B1* | 8/2002 | Roohparvar | 365/185.33 |
| 6,654,313 | B1* | 11/2003 | Roohparvar | 365/233 |
| 6,903,981 | B1 | 6/2005 | Futatsuyama et al. | |
| 6,977,845 | B1* | 12/2005 | Kawai et al. | 365/185.21 |

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A semiconductor memory device includes: a plurality of cell array blocks in each of which a plurality of memory cells are arranged; address decode circuits for selecting memory cells in the cell array blocks; sense amplifier circuits for reading cell data of the cell array blocks; and a busy signal generation circuit for generating a busy signal to the chip external, wherein in a first read cycle selecting a first area in a first cell array block, cell data read operations for the first area of the first cell array block and a second area of a second cell array block are simultaneously executed, while the busy signal generation circuit generates a true busy signal, and then a read data output operation is executed for outputting the read out data of the first area held in the sense amplifier circuits to the chip external, and in a second read cycle selecting the second area in the second cell array block, after the busy signal generation circuit has output a dummy busy signal shorter in time length than the true busy signal without executing cell data read operation, a read data output operation is executed for outputting the read out data of the second area held in the sense amplifier circuits to the chip external.

16 Claims, 16 Drawing Sheets

SEMICONDUCTOR MEMORY DEVICE AND ELECTRIC DEVICE WITH THE SAME

CROSS-REFERENCE TO RELATED APPLICATION

This application is a continuation of U.S. application Ser. No. 10/856,986, now U.S. Pat. No. 6,977,845 and claims the benefit of priority from the prior Japanese Patent Application No. 2003-188330, filed on Jun. 30, 2003, the entire contents of which are incorporated herein by reference.

BACKGROUND OF THE INVENTION

1. Field of the Invention

This invention relates to a semiconductor memory device and an electric device with the same.

2. Description of Related Art

Currently known EEPROMs are usually formed of memory cells with floating gates in which charges are stored in a non-volatile manner. Arranging NAND cell units each having a plurality of memory cells in series, a cell array of a NAND type flash memory, which is known as one of these EEPROMs, is configured. Source and drain diffusion layers are shared with adjacent memory cells in the NAND cell unit. Therefore, the NAND flash memory has a feature that it is possible to achieve a large capacity with a relatively small chip size by increasing number of memory cells in the NAND cell unit.

As described above, in the NAND type flash memory, a NAND cell unit is formed of serially connecting plural memory cells, and connected to a bit line via a select gate transistor. Data read operation is performed by detecting whether the bit line is discharged or not by a selected cell, or whether the bit line discharge is large or not. To non-selected cells, a pass voltage is applied, which makes the cells on in spite of the cell data. However, due to the fact that plural memory cells are serially connected in the NAND cell unit, the channel resistance of the NAND cell unit is large, thereby resulting in that read out cell current is small.

For this reason, it takes a long time until the bit line voltage difference becomes to be a predetermined value due to cell data. Usually, it is required of taking a data read time of 20 to 25 μsec. The memory chip outputs a busy signal during the data read operation, which notes that the chip is in a data read operation state.

FIG. 13 shows a data read operation of a conventional NAND type flash memory. Input write enable signal WEn (="L") and address enable signal ALE(="H") from the chip external, and input address from I/O terminal, and data read operation for cell array starts. Usually, in the NAND type flash memory, data read is done by one page. When data read starts, busy signal R/B="L" (True Busy) is output to the external of the chip.

After the read operation has been performed for a predetermined time, 1 page read out data held in the sense amplifiers is output to the I/O terminal via an I/O buffer in response to read enable signal REn. Up to this, one cycle of data read is done. That is, one cycle of the data read operation includes a data read operation from the cell array to the sense amplifier (hereinafter refers to "cell data read" operation) and an output operation for outputting the data held in the sense amplifier to the chip external (hereinafter refers to "read data output" operation). In order to sequentially read out plural pages, similar read cycles are periodically performed.

FIG. 14 shows another data read operation, a data read time of which is shortened by use of address increment. In this case, address input operations are omitted for the following pages. Once the head address is input in the first cycle, internal addresses are incremented in the following cycles, whereby sequential read operations may be done.

In both cases of FIGS. 13 and 14, while the busy signal, R/B="L", is output, it is impossible to do a cell data read operation. If the number of cells in a NAND cell unit is more increased, and the memory capacitance becomes larger, the cell current becomes smaller, whereby it takes a longer time for a data read operation.

By adding a data circuit (for example, shift register) for temporally hold the read out data from the cell array, read/write operation speed may be improved (for example, Japanese Patent Application Laid Open No. 2002-15585).

To increase the capacitance without changing the specification of the NAND type flash memory, plural cell array blocks with the same capacitance are arranged. In this case, the respective cell array blocks have row decoders and sense amplifiers in order to make them independently accessible of each other.

In such a large capacitive NAND type flash memory, and in such a case that data of the plural cell blocks are sequentially read, if it is necessary to use a method that an address input is done for each read operation, and a busy signal is output during each cell data read operation, high-speed data read becomes to be difficult. For example, in a case that various status data (defect address dada, protect information, history information, ID information and the like) stored in all cell blocks are read out to be checked at a power-on time of the memory chip, it takes a very long time in spite of that the data amount is little.

SUMMARY OF THE INVENTION

According to an aspect of the present invention, there is provided a semiconductor device including:

a plurality of cell array blocks in each of which a plurality of memory cells are arranged;

address decode circuits for selecting memory cells in the cell array blocks;

sense amplifier circuits for reading cell data of the cell array blocks; and a busy signal generation circuit for generating a busy signal to the chip external, wherein in a first read cycle selecting a first area in a first cell array block, cell data read operations for the first area of the first cell array block and a second area of a second cell array block are simultaneously executed, while the busy signal generation circuit generates a true busy signal, and then a read data output operation is executed for outputting the read out data of the first area held in the sense amplifier circuits to the chip external, and in a second read cycle selecting the second area in the second cell array block, after the busy signal generation circuit has output a dummy busy signal shorter in time length than the true busy signal without executing cell data read operation, a read data output operation is executed for outputting the read out data of the second area held in the sense amplifier circuits to the chip external.

DETAILED DESCRIPTION OF THE EMBODIMENTS

Illustrative embodiments of this invention will be explained with reference to the accompanying drawings below.

Figure 1:
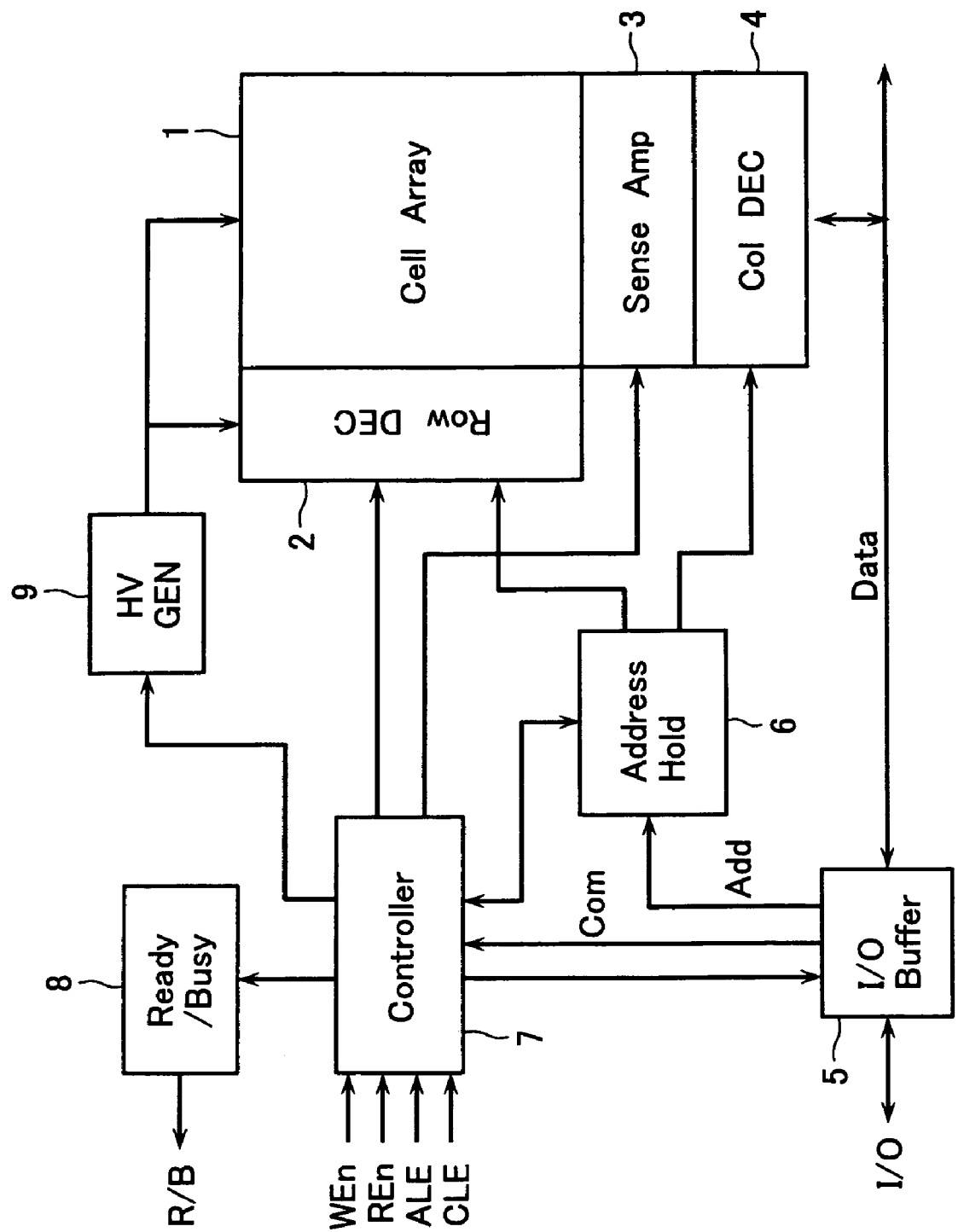
FIG. 1 shows a configuration of functional blocks of a NAND type flash memory in accordance with an embodiment of the present invention.

FIG. 1 shows a functional block configuration of a NAND type flash memory in accordance with an embodiment of the present invention. A cell array 1 is formed of floating-gate type memory cells arranged in a matrix manner. A row decoder (including word line driver) 2 is disposed to select blocks and selectively drive word lines and select gate lines. A sense amplifier circuit 3 has sense amplifiers necessary for sensing bit line data of 1 page, which constitutes a page buffer.

1-page read out data are selected by column decoder (column gates) 4 to be output to the external I/O terminal through I/O buffer 5. Write data supplied from the I/O terminal is selected by the column decoder 4 to be loaded in the sense amplifier circuit 3. Address signal Add is input to address hold circuit 6 through the I/O buffer 5, and row and column addresses are transferred to the row decoder 2 and column decoder 4, respectively.

A controller 7 outputs internal timing signals for reading, writing and erasing in response to control signals such as write enable signal /WE, read enable signal /RE, address latch enable signal ALE and command latch enable signal CLE and the like, thereby controlling data write and erase sequence and data read operation based on the internal timing signals. A high voltage generation circuit 9 is controlled by the controller 7 to generate various high voltages necessary for data write and erase. A busy signal generation circuit 8 outputs a busy signal R/B for noticing the access state of the cell array to the chip external in correspondence with operation modes.

Figure 2:
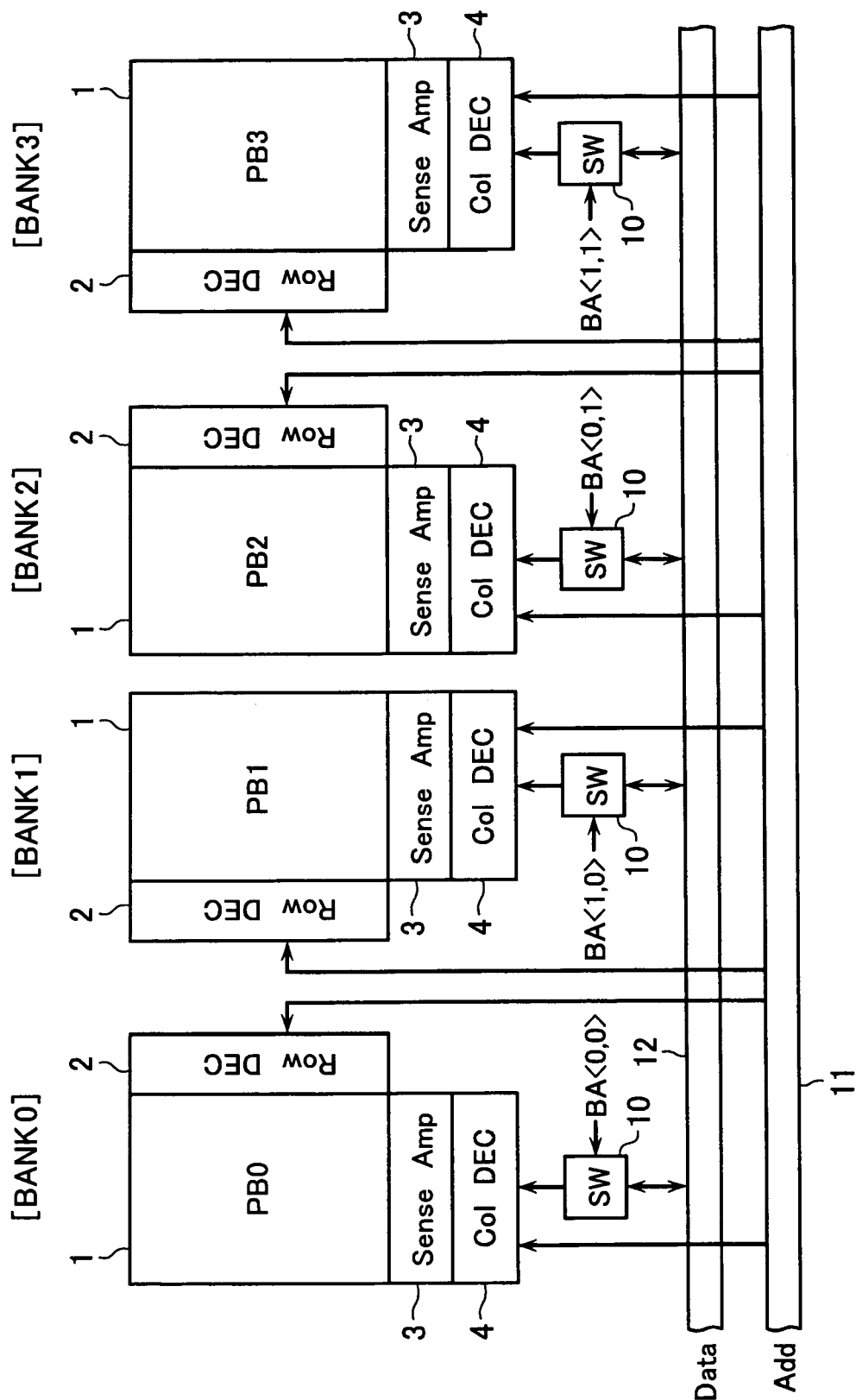
FIG. 2 shows a bank configuration of the NAND type flash memory.

In a practical memory chip, the cell array 1 is configured to have a plurality of cell blocks which are physically independent of each other. FIG. 2 shows an example in which four cell array blocks PBi (i=0, 1, 2, 3) are arranged. These cell array blocks PBi constitute memory banks BANK0–3 each having row decoder 2, column decoder 4 and sense amplifier circuit 4. The memory banks BANK0–3 are independently accessible of each other in principle. Address bus 11 and data bus 12 are commonly disposed for the entire banks. At the respective banks, bank switches 10 are disposed which are controlled by bank address BA, whereby data transfer between the respective banks and the data bus 12 are controlled.

Figure 3:
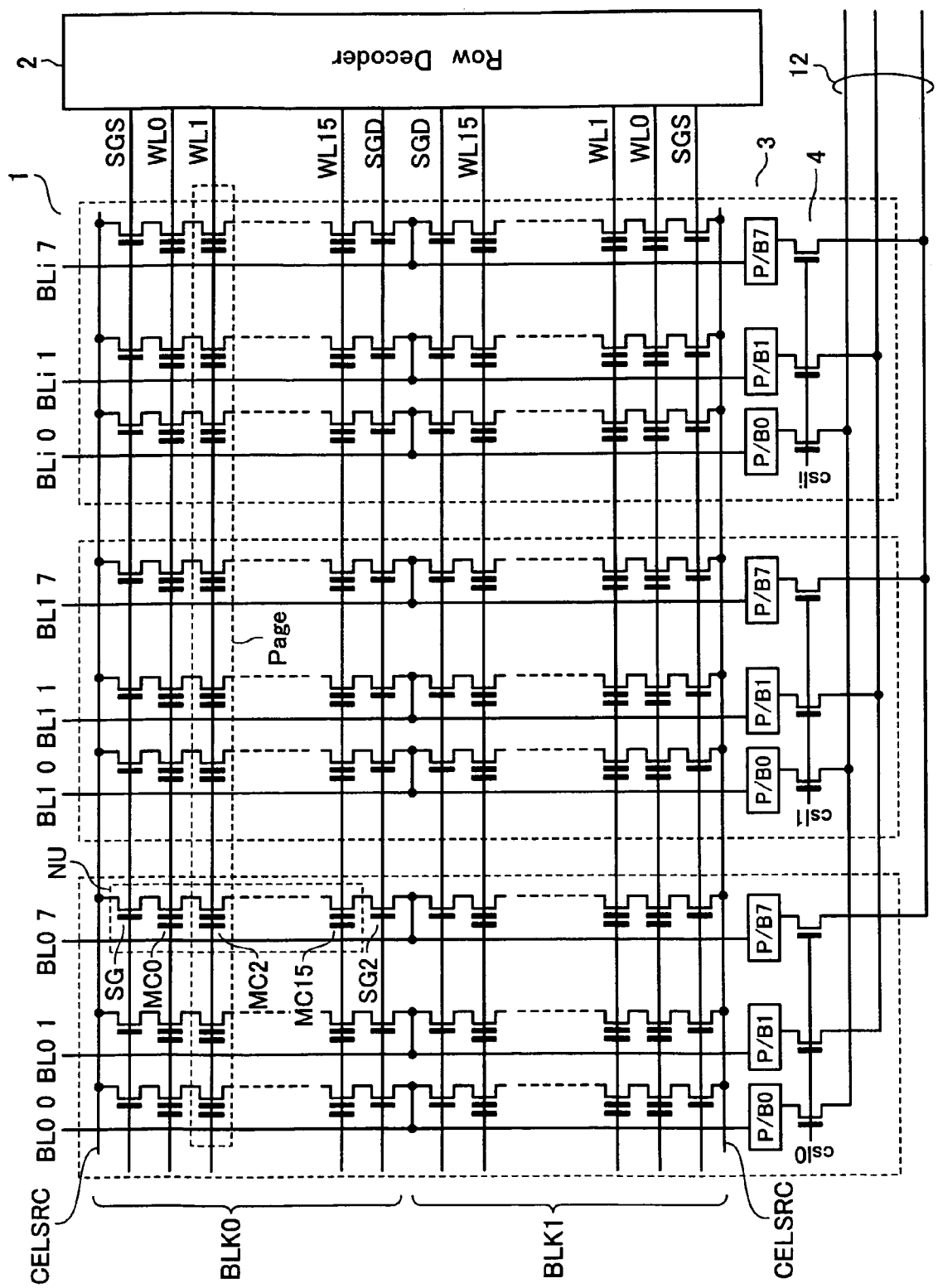
FIG. 3 shows a cell array of the embodiment.

FIG. 3 shows a detailed configuration of the cell array 1. Cell array 1 has plurality of word lines WL and bit lines BL which intersect each other. At each crossing point of the word lines WL and bit lines BL, memory cell MC is disposed. Plural memory cells (16 memory cells in this example) MC0–MC15 are serially connected to constitute a cell string. A select gate transistor SG1 is disposed between a source of one end cell of the cell string and common source line CELSRC, and another select gate transistor SG2 is disposed between a drain of the other end cell of the cell string and bit line BL. One cell string and two select gate transistors disposed at the both end of the string constitute a NAND cell unit NU.

Control gates of the memory cells MC0–MC15 are connected to the different word lines WL0–WL15, and gates of the select gate transistors SG1, SG2 are connected to select gate lines SGS, SGD, respectively, which are disposed in parallel with the word lines WL0–WL15. A group of memory cells arranged along one word line constitute a "page" which serves as a unit of data read and write. A group of NAND cell units arranged in the direction of the word lines constitute a "block" which usually serves as a unit of data erase. In the direction of the bit lines, plural blocks BLK0–BLKn are disposed.

Figure 4:
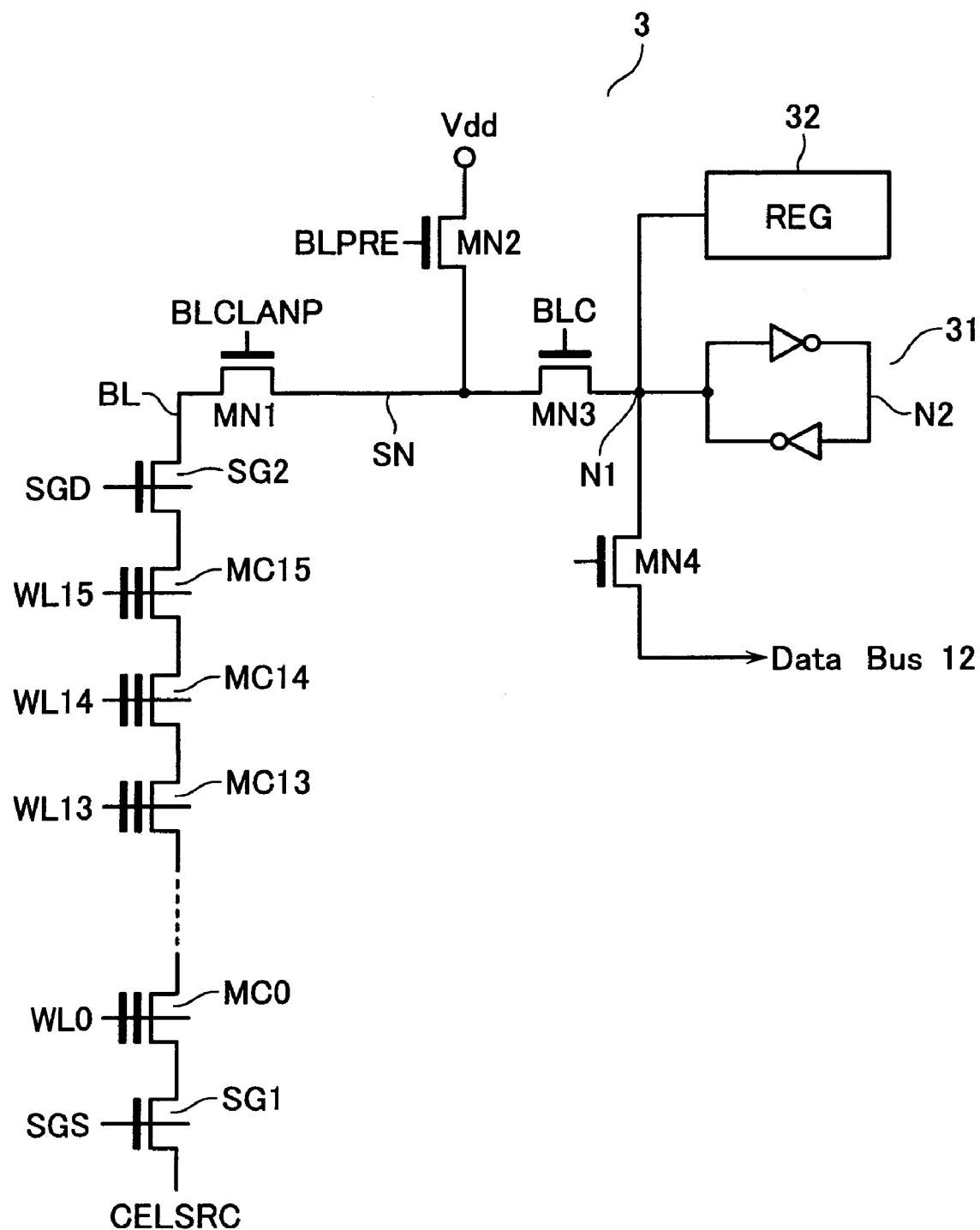
FIG. 4 shows a sense unit of a sense amplifier circuit of the embodiment.

FIG. 4 shows a sense unit of the sense amplifier circuit 3 serving as a page buffer. This sense unit has a data latch 31 for sensing read data and for holding write data. The data latch 31 has two data nodes N1 and N2. One node N1 is connected to a sense node SN through a transfer gate NMOS transistor MN3. The sense node SN is connected to a bit line BL through a clamping NMOS transistor MN1. To the sense node SN, a precharging NMOS transistor MN2 is connected, which is used to precharge the sense node SN and bit line BL.

A data storing circuit 32 is connected to the node N1 for temporarily storing write data and for writing back a corrected write data into the data latch 31. In detail, data write is performed by repeating write pulse applications and verify-reads. In this write scheme, write data in a write cycle is required of being written back based on the relationship between the loaded write data and sensed data in the last write cycle. The data storing circuit 32 is used for writing back the write data in such a situation.

Data node N1 is collected to one of data bus 12 through a column gate NMOS transistor MN4.

Figure 6:
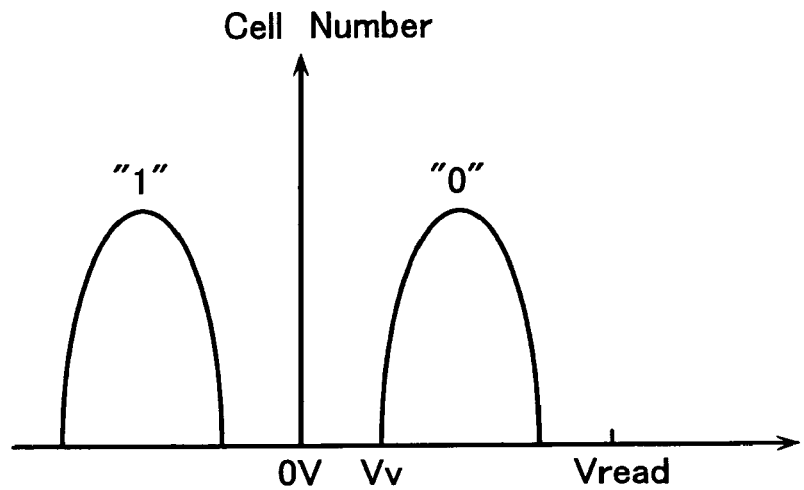
FIG. 6 shows a threshold distribution of data in the embodiment.
Figure 7:
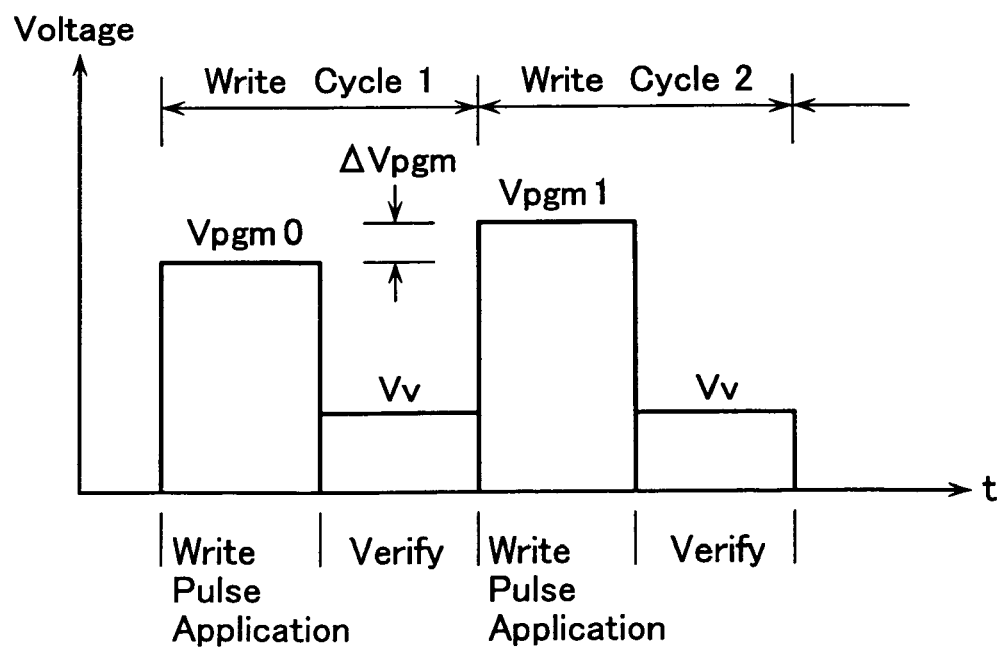
FIG. 7 shows a diagram for explanation of a write operation in the embodiment.

Data write and read operations performed by use of the sense amplifier 3 will be explained in brief. Prior to data write, data erase is performed for a selected block. Whereby, all cells in the selected block become to be a "1" data state (i.e., erase state) with a negative threshold. In a binary data storing scheme, the threshold distribution of "0" and "1" data is set as shown in FIG. 6. Data write is performed for each page. To the bit line BL, Vss and Vdd are applied in response to write data "0" and "1", respectively, and transferred to the channels of selected cells in NAND cell units. A NAND cell channel, to which data "1" is applied, is precharged to Vdd-Vth (Vth; threshold voltage of select gate transistor) to be in a floating state.

When boosted write voltage Vpgm is applied to the selected word line in such a situation, in a "0" write cell, electrons are injected to the floating gate from the channel by FN tunneling. Whereby, a positive threshold "0" data state is written into the "0" write cell. In a "1" write cell (write inhibit cell), electron injection does not occur because the channel is boosted by capacitive coupling.

In a practical data write sequence, in order to drive the data threshold distribution into a predetermined region, write pulse applications and verify-reads for verifying the written state are repeated. Based on the verify-read in each write cycle, In the sense amplifier circuit 3, a "write inhibit" state (i.e., "1" data write state) is set for a cell that "0" write is completed, and write data is rewritten for a "0" data cell that is insufficiently written.

In a data read mode, sense node SN and bit line BL are percharged to Vdd by turning on the precharge NMOS transistor MN2 and the clamping NMOS transistor MN1. Then, 0V is applied to a selected word line, and pass voltage Vread, which turns on cells without regard of cell data, is applied to non-selected word lines. It is decided by the selected cell's data whether the bit line is discharged or not, or the amount of bit line discharge. Therefore, transfer the bit line voltage to the data node N1 through the clamping NMOS transistor MN1 and transfer gate NMOS transistor MN3, and data "0" and "1" may be sensed. A verify-read operation is done under the same condition as the normal data read except that verify judging voltage Vv (as shown in FIG. 6) is applied to a selected word line.

Figure 5:
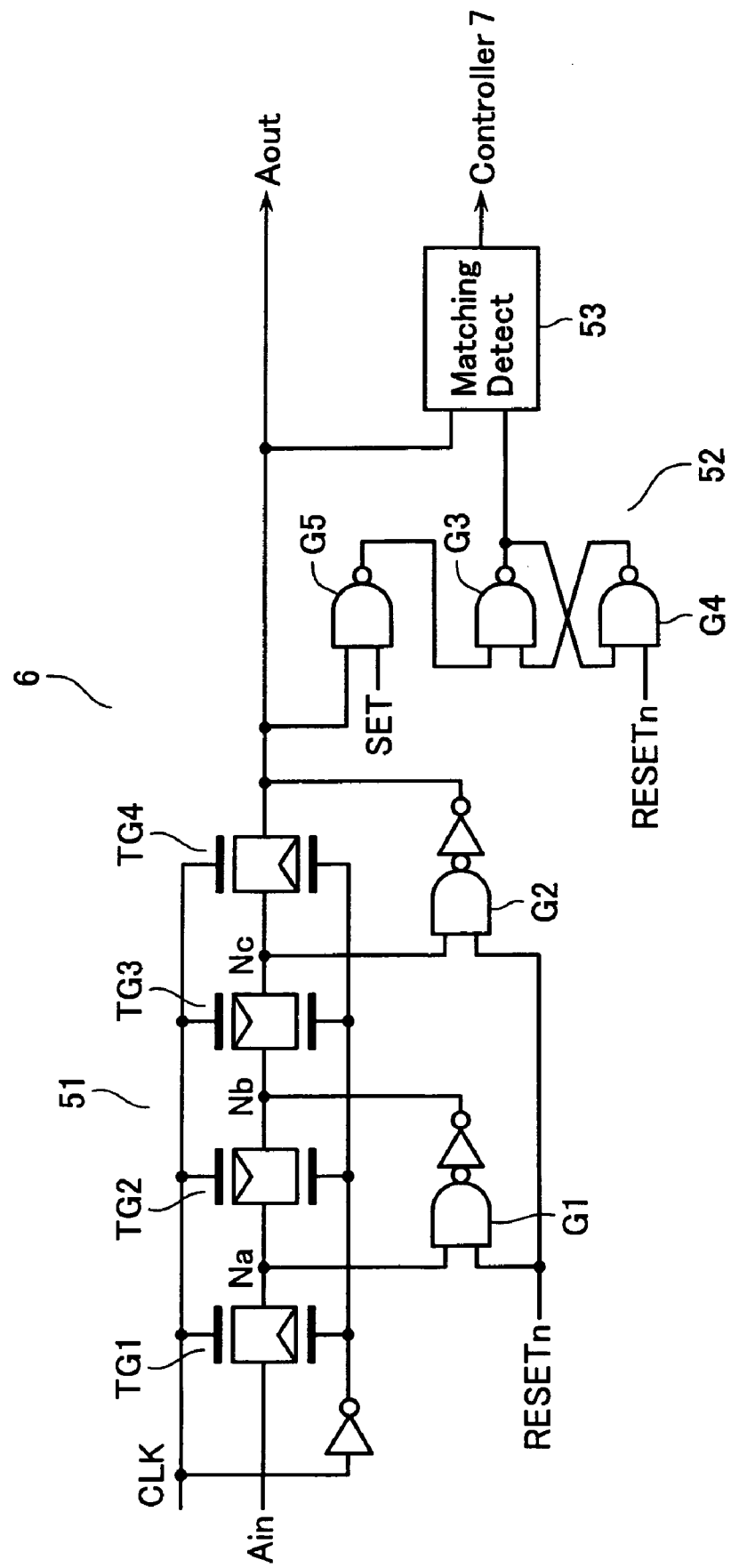
FIG. 5 shows an address hold circuit of the embodiment.

FIG. 5 shows a circuit portion of row address system for page selection in the address hold circuit 6 with respect to one address bit. Four CMOS transfer gates TG1–TG4, which are driven by clock CLK, are serially connected to constitute an address transfer circuit 51 which transfers and holds an address bit supplied to an address input node Ain. Transfer gates TG1 and TG4 turn on when clock CLK is "H", while transfer gates TG2 and TG3 turn on when CLK="L". Data at a node Na to which transfer gates TG1 and TG2 are connected may be transferred to a node Nb to which transfer gates TG2 and TG3 via a NAND gate G1 which is activated by reset signal RESETn="H". Similarly, Data at node Nc to which transfer gates TG3 and TG4 are connected may be transferred to an address output node Aout via a NAND gate G2 which is activated by reset signal RESETn="H".

Therefore, when reset signal RESETn="H", and clock CLK="H", an address bit data supplied to the address input node Ain is transferred to node Na through transfer gate TG1. At this time, although transfer gate TG2 is off, address bit data at the node Na is transferred to the node Nb through NAND gate G1. When clock CLK becomes "L", transfer gates TG1 and TG4 becomes off, and transfer gates TG2 and TG3 becomes on. Therefore, transferred address bit data is held at node Na, Nb and Nc, and simultaneously output to the address output node Aout through NAND gate G2.

To the address output node Aout, an address latch 52 is connected, which serves for holding the address bit data until the next address is input. The address latch 52 is constructed by NAND gates G3 and G3, inputs and outputs of which are cross-coupled. Address bit data at the address output node Aout is latched in the address latch 52 through a NAND gate G5 which is activated by a set signal SET. The set signal SET is a timing signal output when data read is finished.

Further, to the address output node Aout, an address matching detect circuit 53 is connected, which detects whether the address bit data output to the address output node Aout coincides with the address bit data in the last read cycle held in the address latch 52 or not. The output of the address matching detect circuit 53 is transferred to controller 7, and serves for controlling to skip the cell data read operation and output a dummy busy signal with a short time length, as described later.

Figure 10:
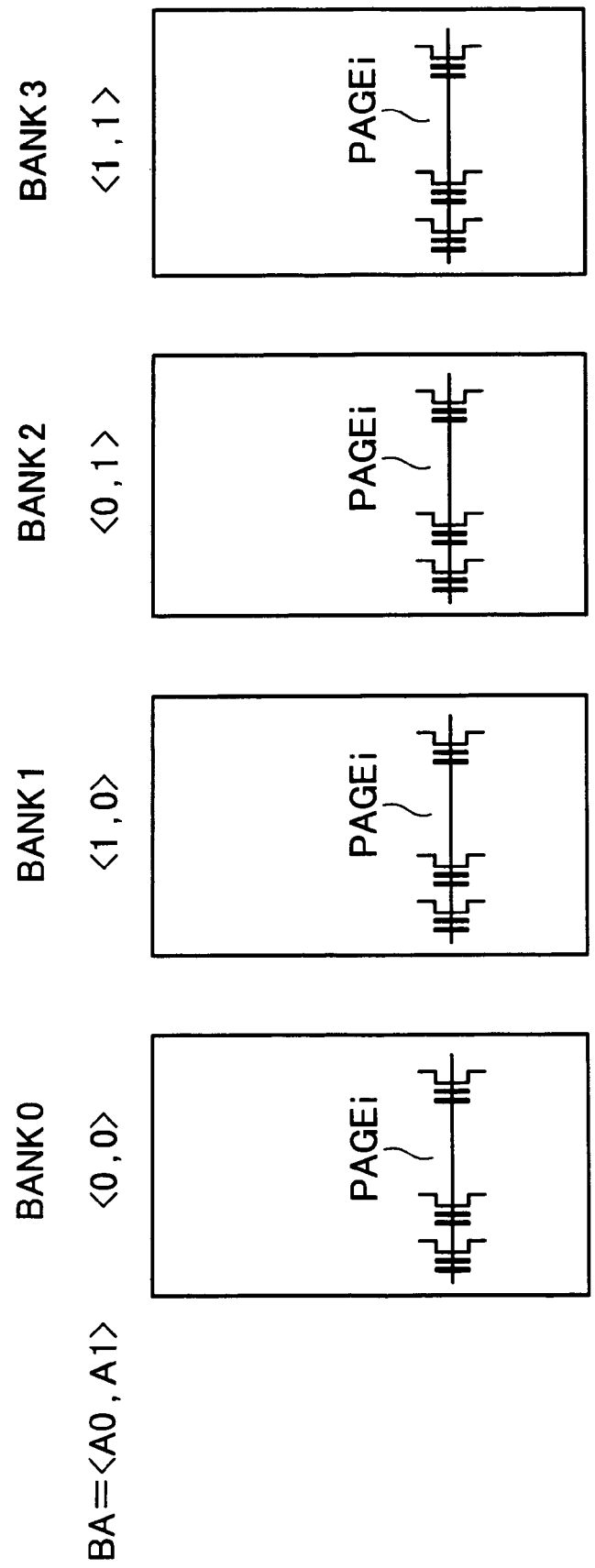
FIG. 10 shows an assignment of bank address in the embodiment.

Next, the data read operation of the NAND type flash memory according to the embodiment will be explained. FIG. 10 shows an address assignment of the banks BANK0–3. As shown in FIG. 10, the lower two bits A0 and A1 in the entire address bits are assigned to a bank address BA. The remaining higher bits A2–An are commonly assigned to page addresses in the respective banks. For example, as shown in FIG. 10, to the corresponding page PAGEi in the respective banks, the same page address is assigned.

In this embodiment, data read operation is, as described above, performed on the assumption that "all bank select mode" (i.e., all banks are simultaneously activated) is set. In detail, with respect to all banks, row decoders 2 are activated and cell data read operations are performed. Note here that the all bank select mode may be statically set in the chip, or lo may be set by a command input. In this embodiment with the above described all bank select mode, when it is required of sequentially reading the corresponding page of the respective banks, the operation control is done in such a manner that a read data output operation is performed without a cell data read operation based on the address matching detection.

Figure 11:
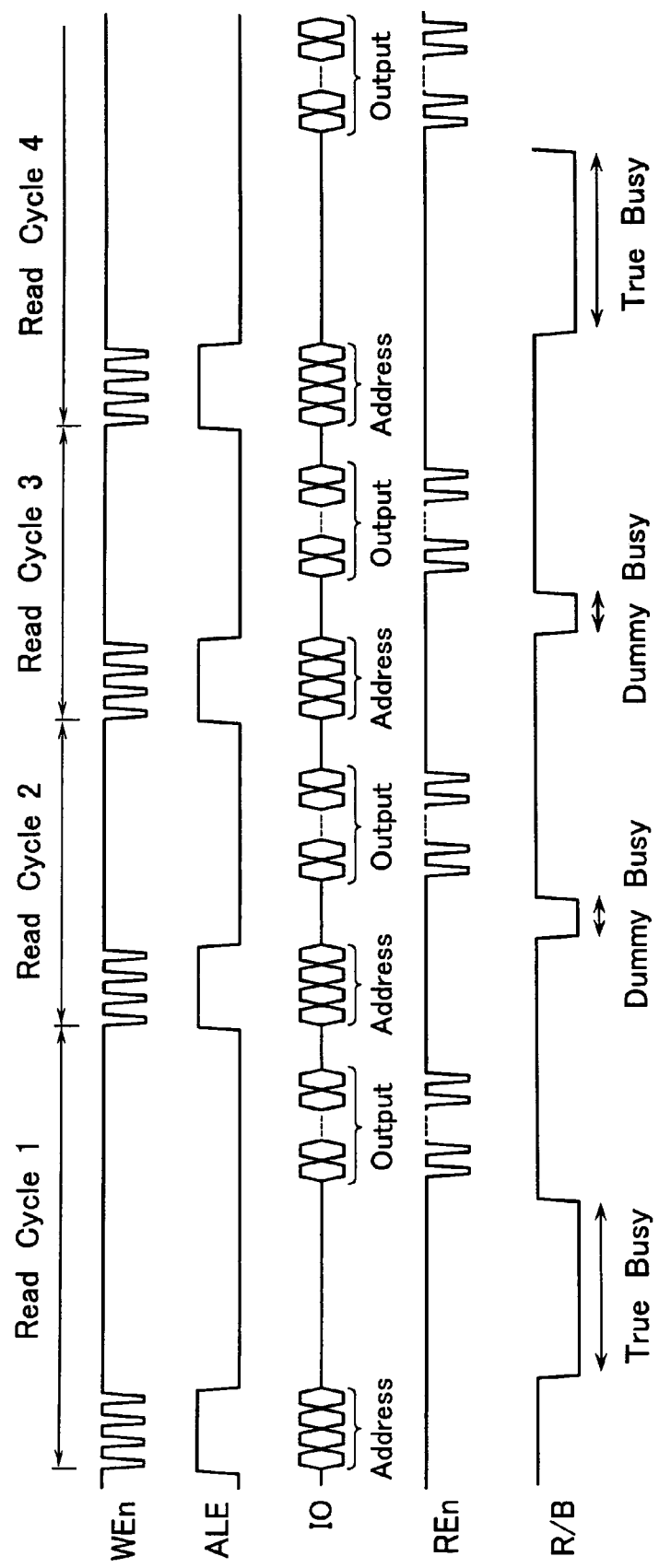
FIG. 11 shows a timing chart of the data read operation by the flow shown in FIG. 8.

FIG. 11 shows an operation-timing chart in a case that plural read cycles are continued. As above described, 1-cycle data read operation includes a "cell data read" operation for sensing data from the cell array to the sense amplifier and a "read data output" operation for outputting the read data held in the sense amplifier to the chip external. In an initial read cycle, Read Cycle 1, write enable signal WEn and address latch enable signal AlE are input, and an address (for example, selects page PAGEi in bank BANK0) is input, then a cell data read operation starts for all banks. During the cell data are read out to the sense amplifier circuit, busy signal R/B="L" (True Busy) is output. When the cell data read operation is finished, the busy signal R/B becomes "H", and the read data output operation for the selected bank is performed in response to the read enable signal REn.

In the following read cycle, Read Cycle 2, an address signal is input as similar to the last cycle. Assume here that the input address is for selecting the same page PAGEi in the bank BANK1 as that of the last cycle, Read Cycle 1 (i.e., only bank addresses BA thereof are different from each other), and the cell data has been read out to the sense amplifier circuit in the last read cycle, Read Cycle 1. Therefore, in response to detection of address coincidence, it is controlled to skip the cell data read operation. At this time, for the purpose of protecting erroneous operations, busy signal R/B="L" (Dummy Busy) is output. The dummy busy signal is shorter in time length than the true busy signal. Then, a read data output operation is performed for the bank BANK1 selected by the bank address BA.

In the next read cycle, Read Cycle 3, assume that the input address is for selecting the same page PAGEi in the bank BANK2, and a read data output operation is performed for the read data corresponding to the bank BANK2 without a cell data read operation as similar to the last cycle, Read Cycle 2. Next read cycle, Read Cycle 4, in FIG. 11 shows a case that the input page address is different from that of Read Cycle 3. Therefore, normal cell data read operation and read data output operation are sequentially performed.

Figure 8:
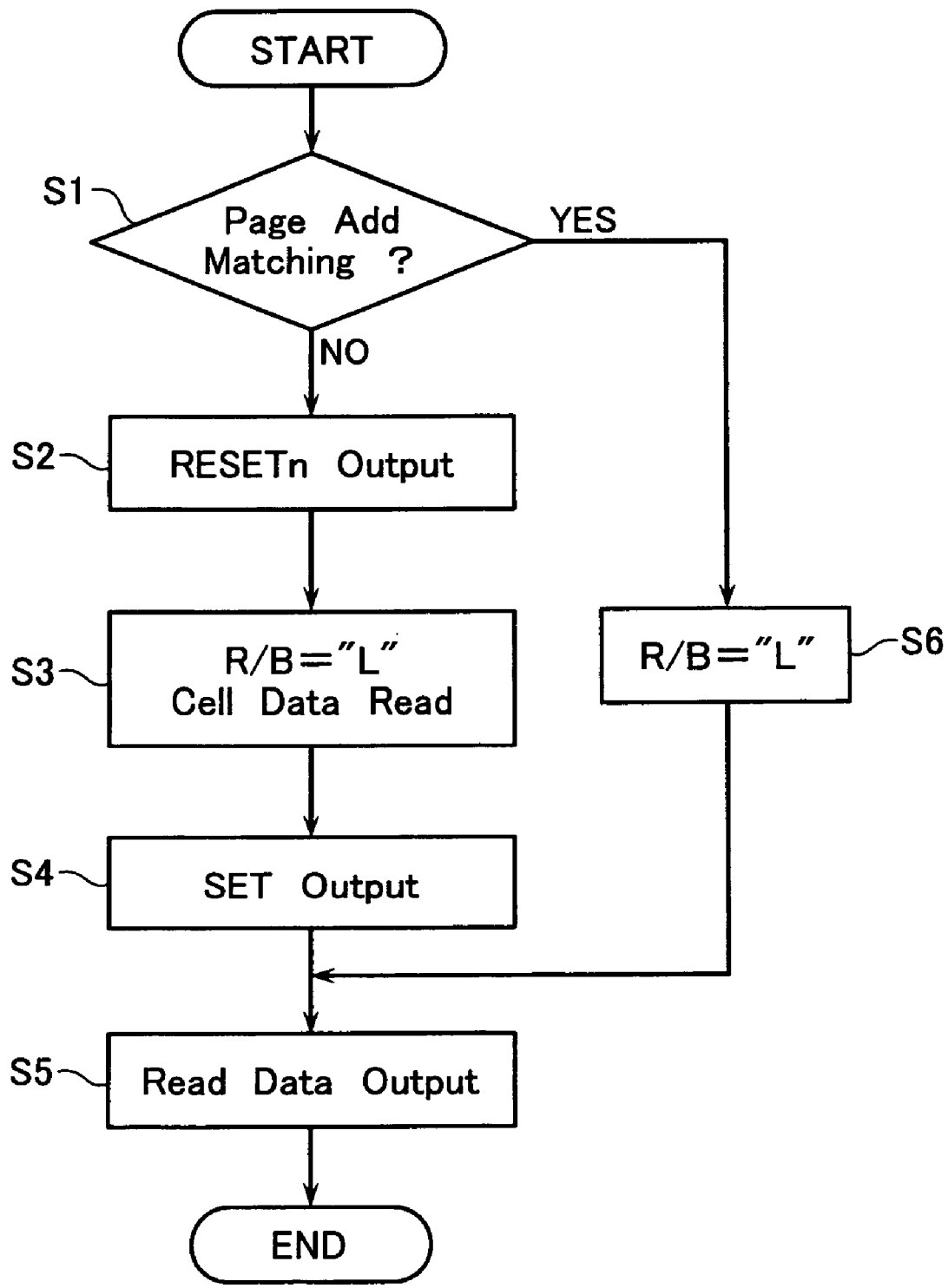
FIG. 8 shows a read operation flow in the embodiment.

FIG. 8 shows an operation control flow of the above-described data read cycles. When an address signal is input, it is detected whether the input address coincides with that supplied in the last read cycle or not (at step S1). In detail, address-matching detection is done with respect to the page addresses. If address coincidence is not detected, reset signal RESETn is output (at step S2), and a normal cell data read operation is performed, while busy signal R/B="L" (True Busy) is output to the chip external (at step S3). The order of steps 2 and 3 is alternative.

When the cell data read operation is finished, set signal SET is output (at step S4). As a result, the input page address is held in the address latch 52 shown in FIG. 5. Successively, a read data output operation is performed (at step S5). If address coincidence is detected at step S1, a dummy busy signal R/B="L" is output (at step S6), and a read data output operation is performed for the read data held in the sense amplifier in correspondence with a bank selected by the input address (at step S5).

As described above, in the NAND type flash memory with the "all bank select mode" according to this embodiment, with respect to a demand for sequentially reading the same page of the different banks in continuous read cycles, cell data read operations are omitted. Therefore, it is possible to achieve a high-speed data read. Additionally, it is appreciated that the conventional specification of the memory control method from the external may be used as it is without changing it.

For example, assume that in this NAND-type flash memory, various status data are stored at the head pages of all banks. In such the flash memory, it becomes possible to do a high-speed power-on check that reads out the entire status data to check. Further, in a case that a multi-value data storing scheme is utilized, it is required of, for the purpose of high-speed data writing, data writing in the "all bank select mode" in spite of the address assignment. In this case, there is much possibility that the data read operation is also performed in the "all bank select mode". Therefore, this embodiment is effective for such the case.

In the case that the lower two bits serve as a bank address as shown in FIG. 10, it is possible to sequentially select the banks by address increment in the chip. By use of such the address increment function, with respect to a demand for sequentially reading the same page of the respective banks, successive address inputs may also be omitted, whereby it is possible to further improve high-speed performance.

Figure 12:
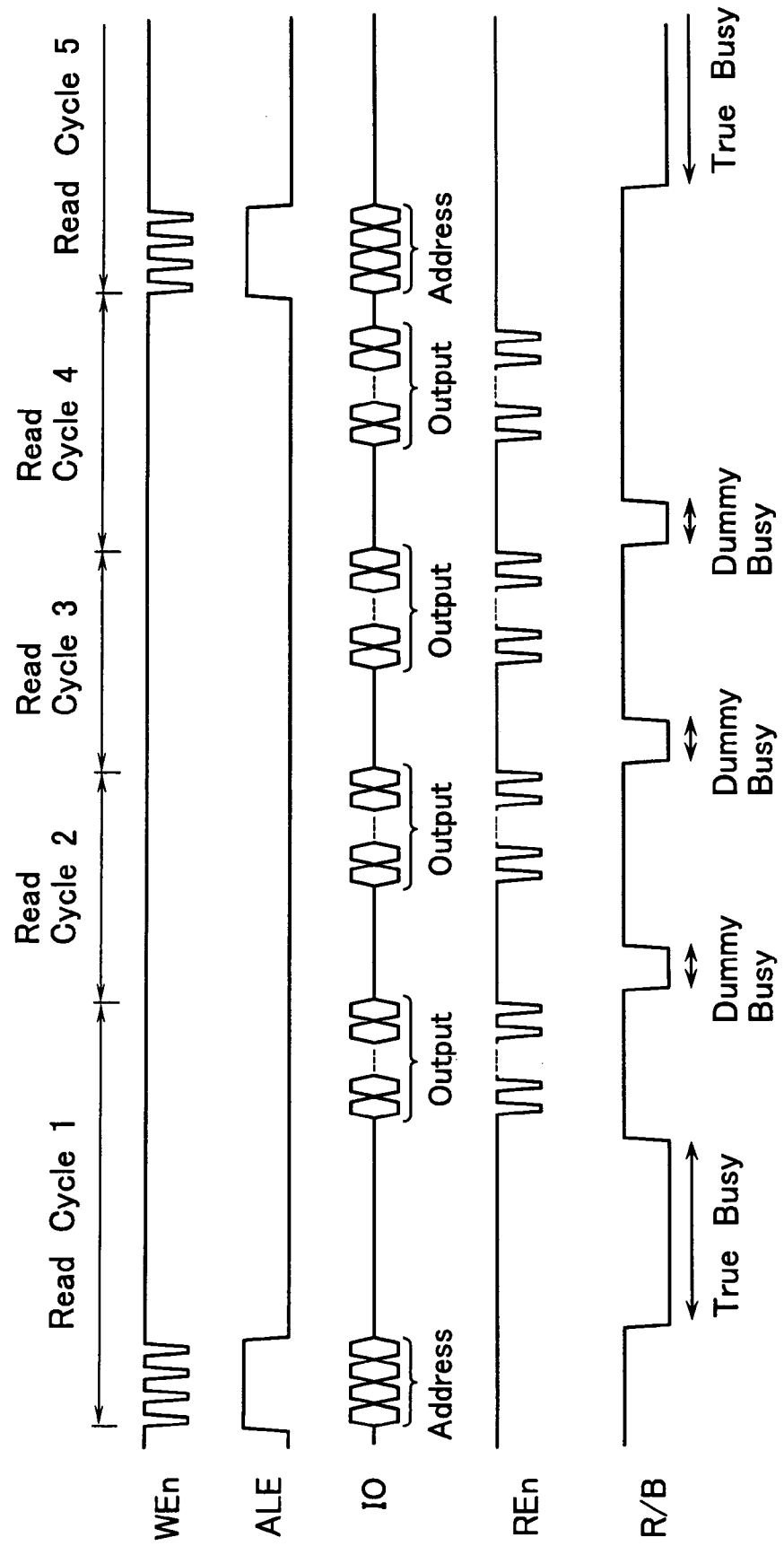
FIG. 12 shows a timing chart of the data read operation by the flow shown in FIG. 9.
Figure 13:
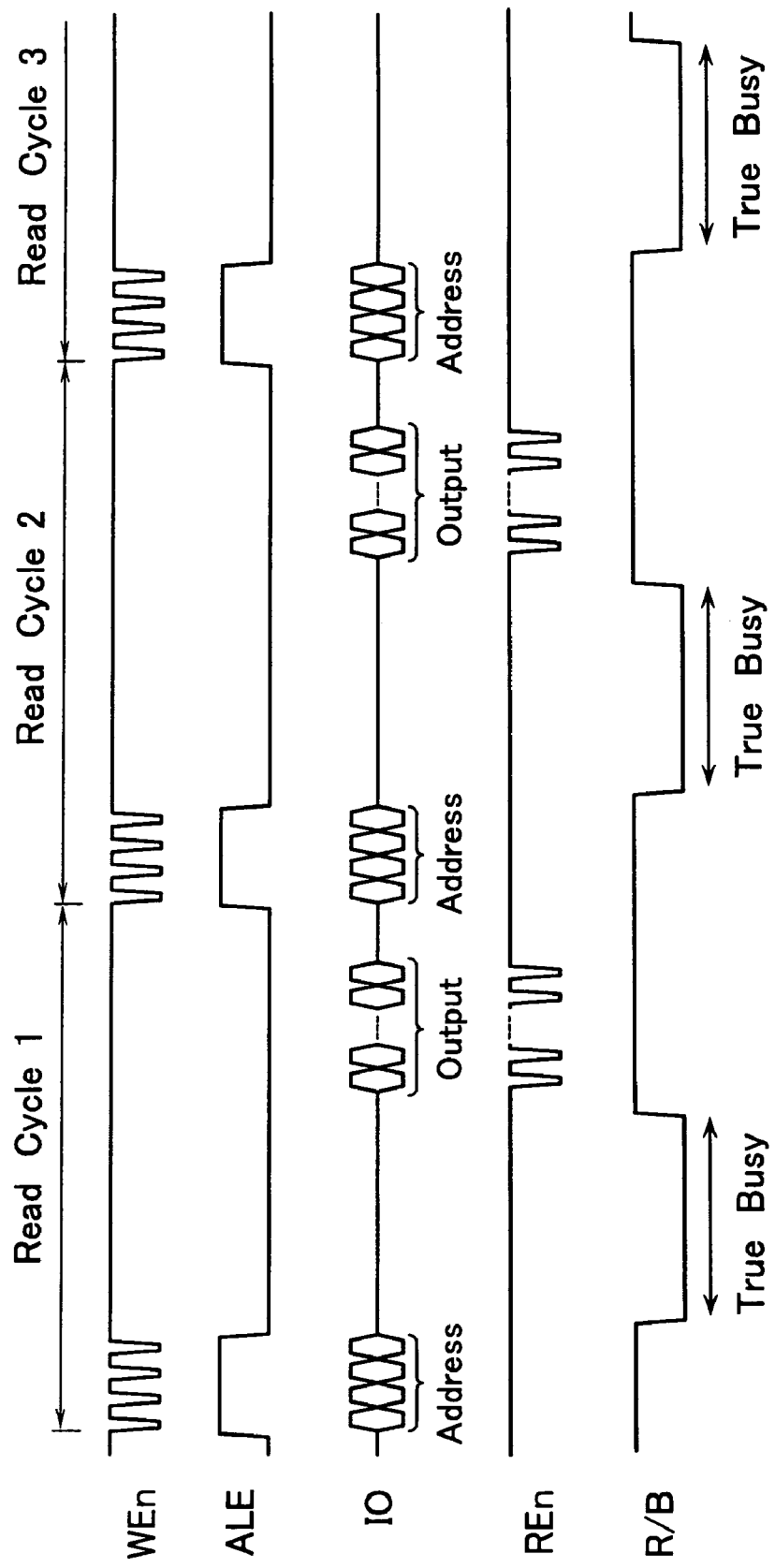
FIG. 13 shows a timing chart of the data read operation in a conventional NAND type flash memory.
Figure 14:
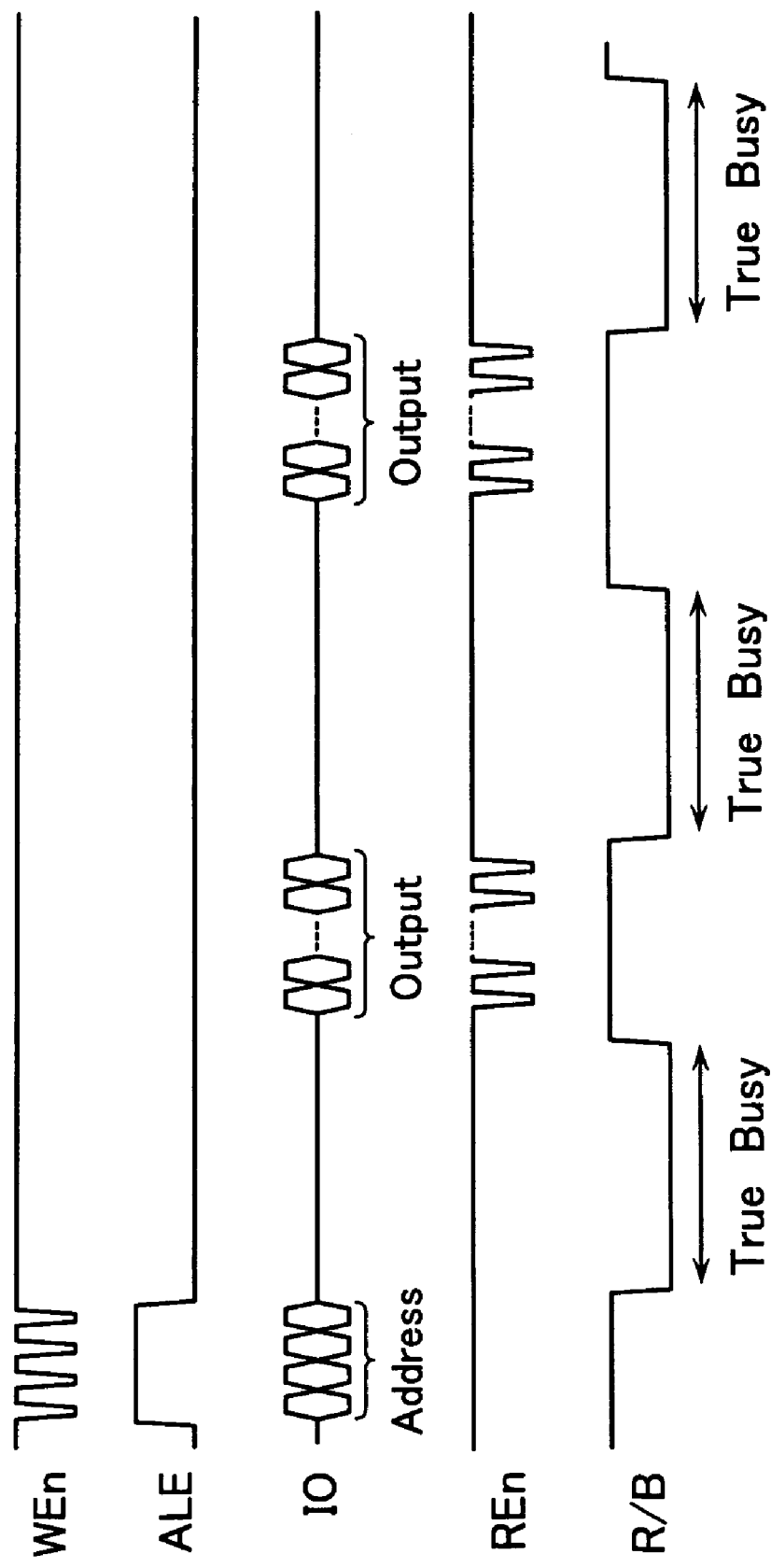
FIG. 14 shows another timing chart of the data read operation in a conventional NAND type flash memory.

FIG. 12 shows a data read timing chart in such the case correspondingly to that shown in FIG. 11. In an initial read cycle, Read Cycle 1, an initial address value is input, and a data read operation is performed as similar to that of FIG. 11. When a continuous access is instructed, in the following read cycle, Read Cycle 2, a short dummy busy signal R/B="L" is output, and the input address is incremented, whereby the read data output operation for the next bank is performed in response to the read enable signal REn. Similar operation controls are continued. FIG. 12 shows an example in which it is instructed to perform continuous data read operations from Read Cycle 1 to Read Cycle 4. It is possible to sequentially read the corresponding pages, PAGEi, in the banks BANK0–3 at high speed.

Figure 9:
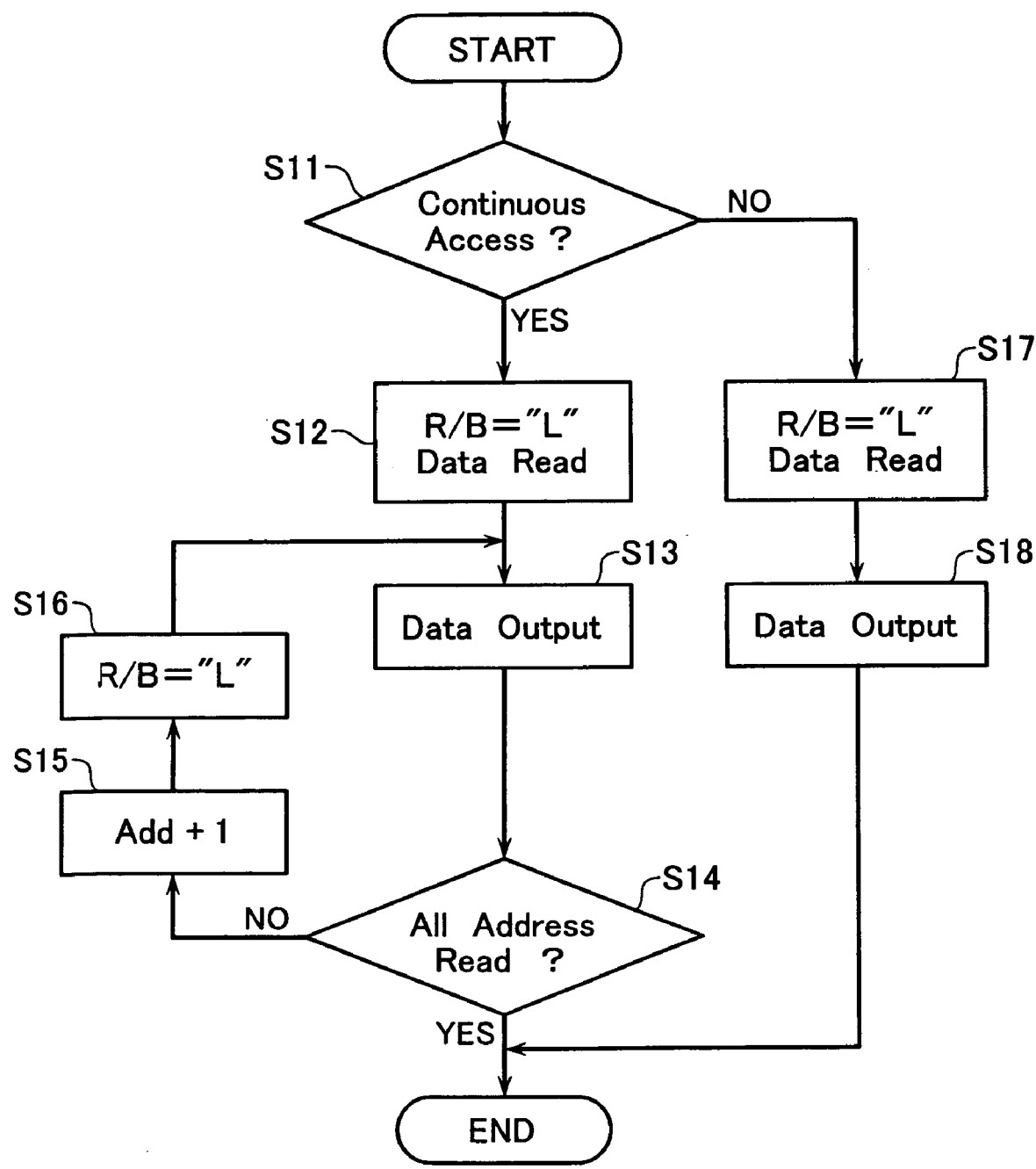
FIG. 9 shows another read operation flow.

FIG. 9 shows an operation control flow of the above-described continuous data read. It is judged, for example, in response to a command input whether the continuous access for a certain address range is instructed or not (at step S11). When the continuous access is instructed, and the input address signal designates a page, PAGEi, in a bank BLK0 (BA=<0,0>), a busy signal R/B="L" (True Busy) is output, and a cell data read operation is performed (at step S12). Thereafter, in response to the read enable signal REn, a read data output operation for the bank BANK0 is performed (at step S13).

After the read data output operation is finished, it is judged whether all data reads for the designated addresses is finished or not (at step S14). If the judged result is "NO", the input address is incremented to output an internal address of BA<1,0> (at step S15). Then a dummy busy signal R/B="L" is output (at step S16), and a read data output operation for the read data of PAGEi in the next bank BANK1, which has already been held in the sense amplifier circuit, is automatically performed (as step S13). Similarly, read data output operations for the respective banks are repeated until all read data of the designated addresses are output.

If such the continuous access is not required, according to the normal data read scheme, cell data read operation in response to the input address (at step S17) and read data output operation (as step S18) are performed.

According to this embodiment, it is possible to read the same blocks and pages in plural banks at a high speed.

Next, as an embodiment, an electric card using the non-volatile semiconductor memory devices according to the above-described embodiment of the present invention and an electric device using the card will be described bellow.

Figure 15:
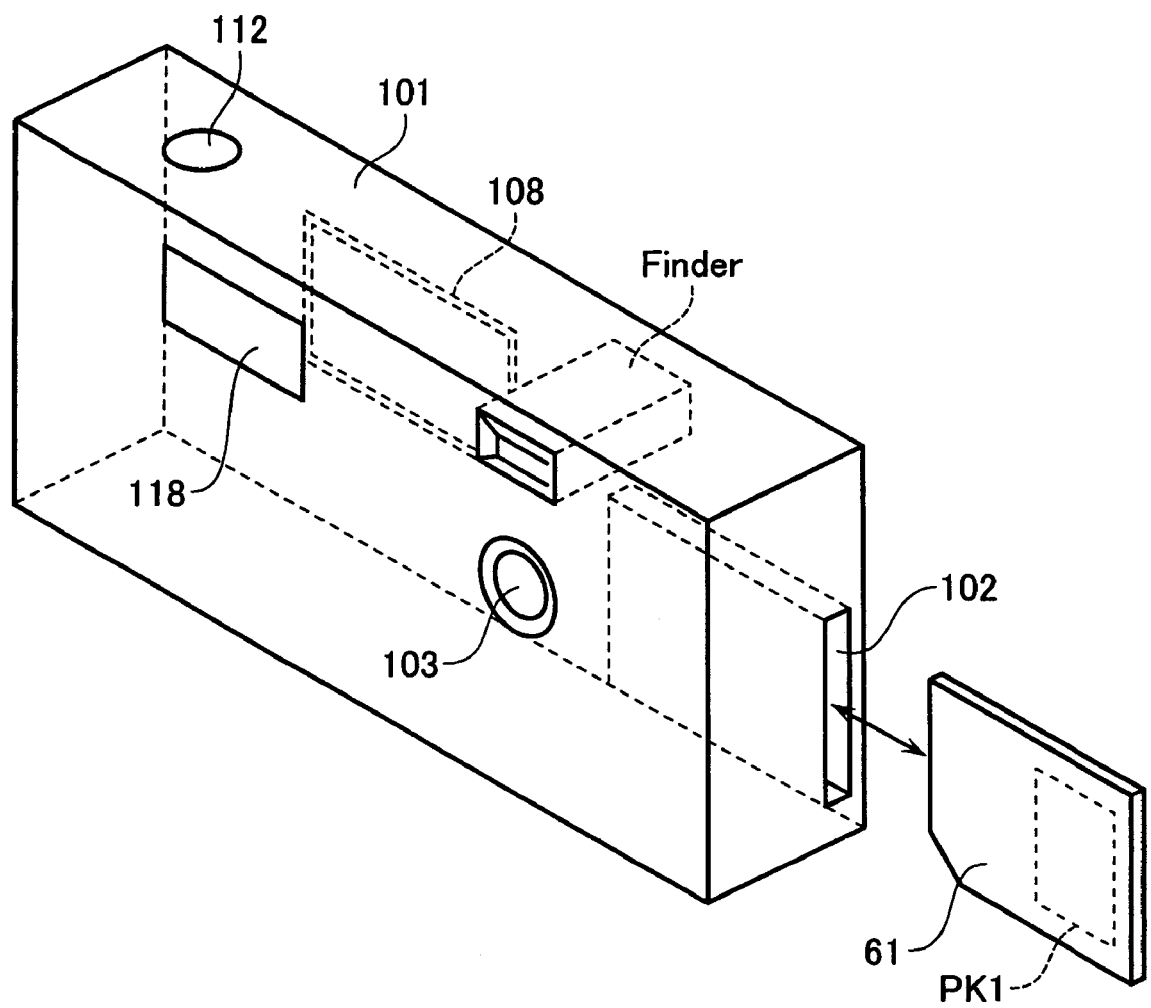
FIG. 15 shows an embodiment which is applied to a digital still camera.

FIG. 15 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 16:
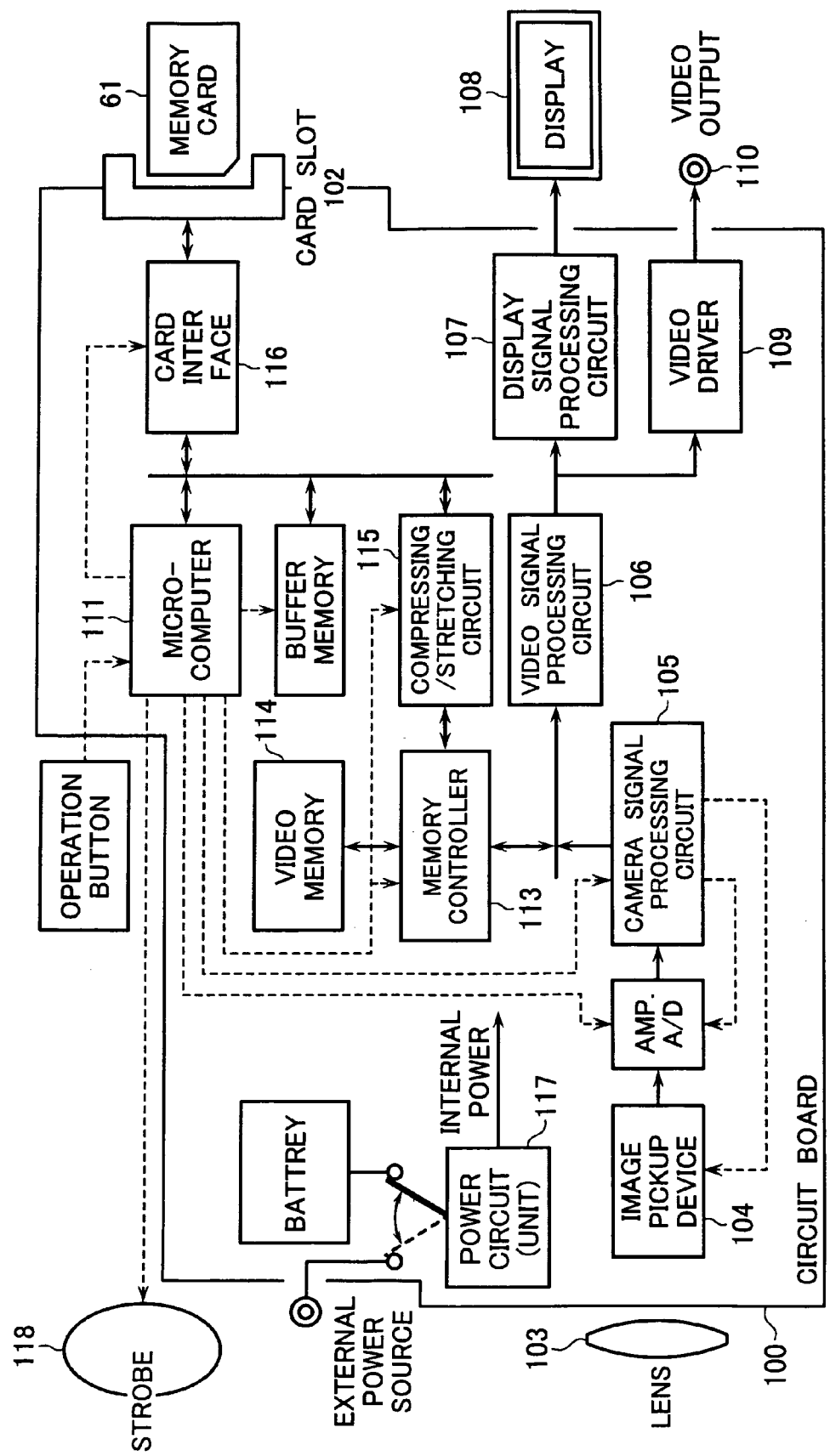
FIG. 16 shows an internal configuration of the digital still camera.
Figure 17A:
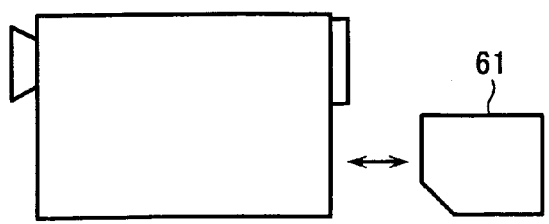
FIGS. 17A to 17J show other electric devices to which the present invention is applied.
Figure 17B:
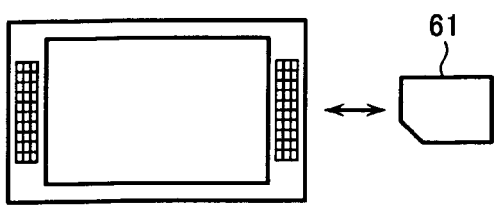
Figure 17C:
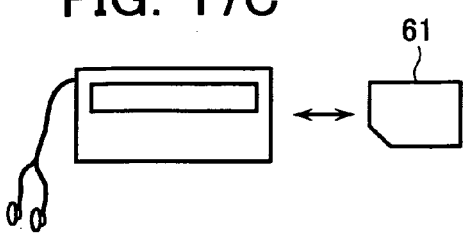
Figure 17D:
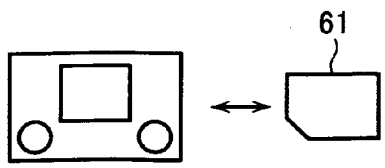
Figure 17E:
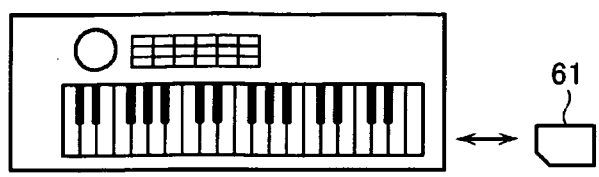
Figure 17F:
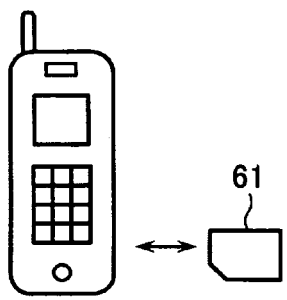
Figure 17G:
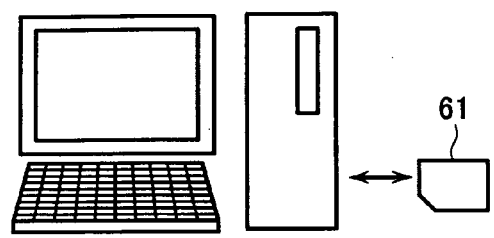
Figure 17H:
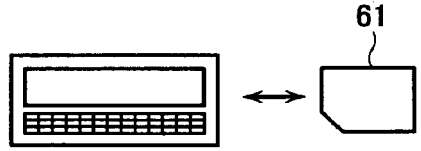
Figure 17I:
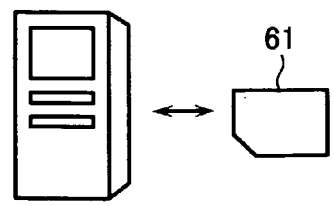
Figure 17J:
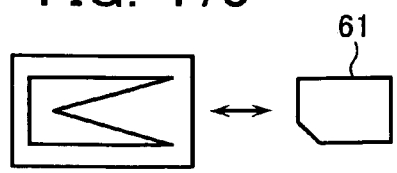

FIG. 16 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a bc-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 17A to 17J, as well as in portable electric devices. That is, the electric card can also be used in a video camera shown in FIG. 17A, a television set shown in FIG. 17B, an audio apparatus shown in FIG. 17C, a game apparatus shown in FIG. 17D, an electric musical instrument shown in FIG. 17E, a cell phone shown in FIG. 17F, a personal computer shown in FIG. 17G, a personal digital assistant (PDA) shown in FIG. 17H, a voice recorder shown in FIG. 17I, and a PC card shown in FIG. 17J.

This invention is not limited to the above-described embodiment. For example, while it has been explained for a NAND type flash memory, it should be appreciated that the present invention may be applied to other non-volatile semiconductor memories of, for example, NOR type, DINOR type and the like. The present invention may also be applied to DRAM. Further, it will be understood by those skilled in the art that various changes in form and detail may be made without departing from the spirit, scope, and teaching of the invention.

What is claimed is:

1. A semiconductor memory device comprising:
a plurality of cell array banks each including a plurality of pages, the same page addresses being assigned to the cell array banks, each bank including a plurality of electrically rewritable and non-volatile memory cells arranged therein;
address decode circuits disposed for the respective cell array banks to select pages in the cell array banks; and
sense amplifier circuits disposed for the respective cell array banks to read cell data of selected pages in the cell array banks, wherein in a first read cycle selecting a first page in a first cell array bank, a second page in a second cell array bank with the same page address as the first page is read simultaneously with the first page, and then the read data of the first page in the first cell array bank is output, and in a second read cycle successive to the first read cycle, the read data of the second page in the second cell array bank, which has been read in the first read cycle, is output.

2. The semiconductor memory device according to claim 1, further comprising:
a busy signal generation circuit for generating a true busy signal to the chip external while cell data read operation is performed, wherein
in the second read cycle, the busy signal generation circuit generates a dummy busy signal shorter in time length than the true busy signal, and then the read data of the second page is output.

3. The semiconductor memory device according to claim 1, further comprising:
an address transfer circuit for transferring input address data to the respective address decode circuits, and holding the address data until the following read cycle;
an address latch circuit for latching bit data corresponding to a page address in the input address data in response to a timing signal; and
an address matching detector circuit for detecting whether the bit data held at the address latch circuit coincide with bit data corresponding to a page address in input addressdata in the following read cycle or not, wherein
the read operation of the second read cycle is controlled by a detected output of the address matching circuit.

4. The semiconductor memory device according to claim 2, further comprising:
an address transfer circuit for transferring input address data to the respective address decode circuits, and holding the address data until the following read cycle;
an address latch circuit for latching bit data corresponding to a page address in the input address data in response to a timing signal; and
an address matching detector circuit for detecting whether the bit data held at the address latch circuit coincide with bit data corresponding to a page address in input address data in the following read cycle or not, wherein
the read operation of the second read cycle is controlled by a detected output of the address matching circuit, and whether the busy signal circuit outputs the true busy signal or the dummy busy signal is determined by a detected output of the address matching circuit.

5. The semiconductor memory device according to claim 1, wherein
the device has such an all bank select mode that the same page address data in the entire cell array banks are read simultaneously in the first read cycle, the read data of a first cell array bank being output in the first read cycle, and the read data of the remaining cell array banks, which have been read in the first read cycle, are sequentially output in the following read cycles successive to the first read cycle without cell data read operations.

6. The semiconductor memory device according to claim 5, wherein
the all bank select mode is set in receipt of a command.

7. The semiconductor memory device according to claim 5, wherein the all bank select mode is set for reading and checking status data stored in the entire cell array banks at a power-on time.

8. The semiconductor memory device according to claim 1, wherein each the cell array bank comprises:
a plurality of word lines;
a plurality of bit lines disposed to intersect the word lines; and
a plurality of NAND cell units each having a cell string with a plurality of memory cells connected in series, control gates thereof being connected to different word lines, a first select gate transistor disposed between one end of the cell string and a corresponding bit line with a gate thereof being connected a first select gate line disposed in parallel with the word lines, and a second select gate transistor disposed between the other end of the cell string and a common source line with a gate thereof being connected to a second select gate line disposed in parallel with the word lines, and wherein
a group of memory cells arranged along each the word line constitutes one page which serves as a unit of data read and data write.

9. An electric card equipped with a semiconductor memory device, the semiconductor memory device comprising:
a plurality of cell array banks each including a plurality of pages, the same page addresses being assigned to the cell array banks, each bank including a plurality of electrically rewritable and non-volatile memory cells arranged therein;
address decode circuits disposed for the respective cell array banks to select pages in the cell array banks; and
sense amplifier circuits disposed for the respective cell array banks to read cell data of selected pages in the cell array banks, wherein
in a first read cycle selecting a first page in a first cell array bank, a second page in a second cell array bank with the same page address as the first page is read simultaneously with the first page, and then the read data of the first page in the first cell array bank is output, and
in a second read cycle successive to the first read cycle, the read data of the second page in the second cell array bank, which has been read in the first read cycle, is output.

10. The electric card according to claim 9, wherein the semiconductor memory device further comprising:
a busy signal generation circuit for generating a true busy signal to the chip external while cell data read operation is performed, wherein
in the second read cycle, the busy signal generation circuit generates a dummy busy signal shorter in time length than the true busy signal, and then the read data of the second page is output.

11. The electric card according to claim 9, wherein the semiconductor memory device further comprising:
an address transfer circuit for transferring input address data to the respective address decode circuits, and holding the address data until the following read cycle;
an address latch circuit for latching bit data corresponding to a page address in the input address data in response to a timing signal; and
an address matching detector circuit for detecting whether the bit data held at the address latch circuit coincide with bit data corresponding to a page address in input address data in the following read cycle or not, wherein
the read operation of the second read cycle is controlled by a detected output of the address matching circuit.

12. The electric card according to claim 10, wherein the semiconductor memory device further comprising:
an address transfer circuit for transferring input address data to the respective address decode circuits, and holding the address data until the following read cycle;
an address latch circuit for latching bit data corresponding to a page address in the input address data in response to a timing signal; and
an address matching detector circuit for detecting whether the bit data held at the address latch circuit coincide with bit data corresponding to a page address in input address data in the following read cycle or not, wherein
the read operation of the second read cycle is controlled by a detected output of the address matching circuit, and whether the busy signal circuit outputs the true busy signal or the dummy busy signal is determined by a detected output of the address matching circuit.

13. The electric card according to claim 9, wherein
the semiconductor memory device has such an all bank select mode that the same page address data in the entire cell array banks are read simultaneously in the first read cycle, the read data of a first cell array bank being output in the first read cycle, and the read data of the remaining cell array banks, which have been read in the first read cycle, are sequentially output in the following read cycles successive to the first read cycle without cell data read operations.

14. The electric card according to claim 13, wherein the all bank select mode is set in receipt of a command.

15. The electric card according to claim 13, wherein the all bank select mode is set for reading and checking status data stored in the entire cell array banks at a power-on time.

16. The electric card according to claim 9, wherein each the cell array bank comprises:
a plurality of word lines;
a plurality of bit lines disposed to intersect the word lines; and
a plurality of NAND cell units each having a cell string with a plurality of memory cells connected in series, control gates thereof being connected to different word lines, a first select gate transistor disposed between one end of the cell string and a corresponding bit line with a gate thereof being connected a first select gate line disposed in parallel with the word lines, and a second select gate transistor disposed between the other end of the cell string and a common source line with a gate thereof being connected to a second select gate line disposed in parallel with the word lines, and wherein
a group of memory cells arranged along each the word line constitutes one page which serves as a unit of data read and data write.

* * * * *